(12) United States Patent
Kawahara et al.

(10) Patent No.: US 12,184,238 B2
(45) Date of Patent: Dec. 31, 2024

(54) AMPLIFIER CIRCUIT

(71) Applicant: DENSO CORPORATION, Kariya (JP)

(72) Inventors: Shogo Kawahara, Kariya (JP); Tetsuya Makihara, Kariya (JP); Takeshi Morinaga, Kariya (JP)

(73) Assignee: DENSO CORPORATION, Kariya (JP)

( * ) Notice: Subject to any disclaimer, the term of this patent is extended or adjusted under 35 U.S.C. 154(b) by 488 days.

(21) Appl. No.: 17/577,970

(22) Filed: Jan. 18, 2022

(65) Prior Publication Data

US 2022/0239258 A1 Jul. 28, 2022

(30) Foreign Application Priority Data

Jan. 27, 2021 (JP) ................................. 2021-011242

(51) Int. Cl.
*H03F 1/02* (2006.01)
*H03F 3/16* (2006.01)

(52) U.S. Cl.
CPC ............ *H03F 1/0288* (2013.01); *H03F 3/16* (2013.01)

(58) Field of Classification Search
CPC ................................. H03F 1/0288; H03F 3/16
USPC ....................................................... 330/295
See application file for complete search history.

(56) References Cited

U.S. PATENT DOCUMENTS

| | | | |
|---|---|---|---|
| 7,068,098 B1 * | 6/2006 | Bell .......................... | H03F 1/42 330/296 |
| 7,362,173 B1 | 4/2008 | Knausz | |
| 9,973,198 B2 * | 5/2018 | Francis ............... | H03F 3/45183 |
| 2009/0021409 A1 | 1/2009 | Mathe et al. | |
| 2016/0079926 A1 | 3/2016 | Ichikura et al. | |
| 2020/0321970 A1 * | 10/2020 | Ghosh .................. | H03K 5/2481 |

FOREIGN PATENT DOCUMENTS

| | | | | |
|---|---|---|---|---|
| CN | 101359898 B | * | 7/2011 | |
| JP | 2003-060934 A | | 2/2003 | |
| KR | 100414264 B1 | * | 4/2004 | ........... H03F 3/4537 |

OTHER PUBLICATIONS

Nasir et al., "A Close Loop Low-Power and High Speed 130 nm CMOS Sample and Hold Circuit Based on Switched Capacitor for ADC Module", IOP Conf. Series: Materials Science and Engineering 226 (2017) 012139 doi: 10.1088/1757-899X/226/1/012139 (Year: 2017).*

* cited by examiner

*Primary Examiner* — Hafizur Rahman
(74) *Attorney, Agent, or Firm* — Posz Law Group, PLC

(57) ABSTRACT

An amplifier circuit includes a main amplifier and an auxiliary circuit that improves a slew rate of the main amplifier. The main amplifier is composed of a one-stage CMOS amplifier, amplifies a voltage difference between two input signals, and outputs, from output terminals, an output signal corresponding to the voltage difference of the input signals. The auxiliary circuit controls an auxiliary bias current flowing through the output terminals according to the voltage difference of the input signals, and interrupts the auxiliary bias current at a predetermined timing before completion of settling. Such a scheme enables improvement of a slew rate by the auxiliary circuit and high-speed operation as well as reduction of error due to mismatch between the main amplifier and the auxiliary circuit, thereby yielding high-accuracy output signal output therefrom.

13 Claims, 10 Drawing Sheets

AMPLIFIER CIRCUIT

CROSS REFERENCE TO RELATED APPLICATION

The present application is based on and claims the benefit of priority of Japanese Patent Application No. 2021-011242, filed on Jan. 27, 2021, the disclosure of which is incorporated herein by reference.

TECHNICAL FIELD

The present disclosure generally relates to an amplifier circuit.

BACKGROUND INFORMATION

A comparison amplifier circuit includes a main amplifier having a two-stage CMOS amplifier that amplifies a voltage difference between two input signals, and outputs an output signal from an output terminal.

However, since the comparison amplifier circuit includes a two-stage CMOS amplifier in which two amplifier circuits are connected in series, allowing many electric current paths and consuming large amount of electric power.

Therefore, in order to reduce power consumption, it is conceivable to adopt an amplifier circuit including a main amplifier 80 having a one-stage CMOS amplifier as shown in FIG. 12. The amplifier circuit includes the main amplifier 80 that amplifies a voltage difference between two input signals, and an auxiliary circuit 81 that corresponds to the slew rate enhancement circuit. The amplifier circuit has a configuration in which the auxiliary circuit 81 controls an auxiliary bias current flowing to/through the output terminal, and the main amplifier 80 can be operated at a high speed.

However, in such an amplifier circuit, if transistor characteristics vary transistor to transistor in the main amplifier 80 and the auxiliary circuit 81, an offset mismatch may occur between the main amplifier 80 and the auxiliary circuit 81. In such case, even after the settling of the output signal of the main amplifier 80 is complete, the auxiliary bias current continues to be supplied to the output terminal of the main amplifier 80, the potential of the output terminal changes, and the accuracy of the output signal of the main amplifier 80 deteriorates, which may be problematic.

SUMMARY

It is an object of the present disclosure to improve the accuracy of an output signal in an amplifier circuit having an auxiliary circuit constituting a slew rate circuit for improving a slew rate, as a main amplifier having a one-stage CMOS amplifier.

BRIEF DESCRIPTION OF DRAWINGS

Objects, features, and advantages of the present disclosure will become more apparent from the following detailed description made with reference to the accompanying drawings, in which.

DETAILED DESCRIPTION

Figure 1:
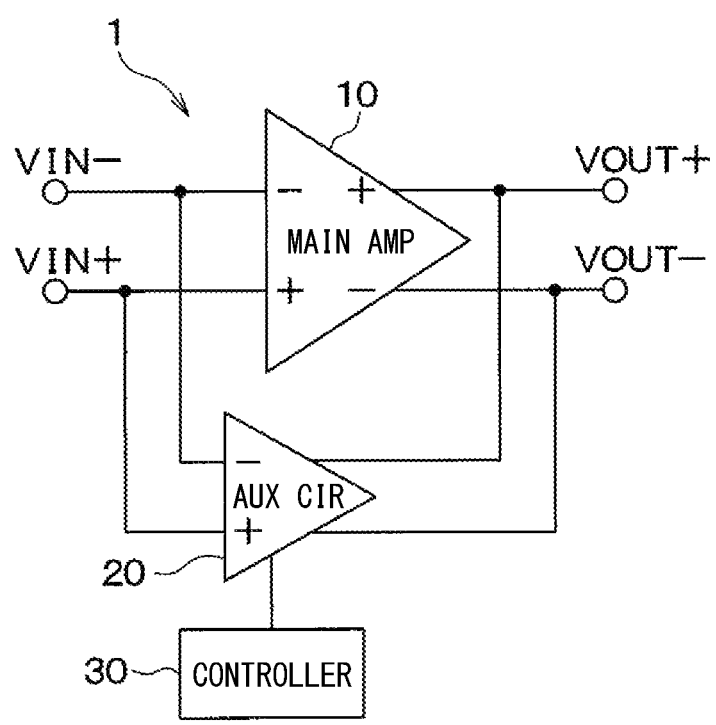
FIG. 1 is a diagram showing an overall configuration of an amplifier circuit according to a first embodiment.

Hereinafter, a plurality of embodiments of the present disclosure are described with reference to the drawings. In the following embodiments, the same or equivalent components are designated by the same/similar reference numerals, and explanations are shared among the same/similar reference-numeraled components.

First Embodiment

An amplifier circuit according to the first embodiment is described with reference to FIGS. 1 and 2. The amplifier circuit 1 is configured as a low power amplifier circuit with low power consumption. The amplifier circuit 1 includes a main amplifier 10, an auxiliary circuit 20, and a controller 30. Note that, the amplifier circuit 1 is a SRE (Slew-Rate Enhancement) type amplifier circuit, in which the main amplifier 10 and the auxiliary circuit 20 are connected in parallel between input terminals VIN+ and VIN− and output terminals VOUT+ and VOUT−. These input and output terminals may all be described as signal terminals. The output terminal VOUT+ corresponds to a positive output terminal, and VOUT− corresponds to a negative output terminal.

The main amplifier 10 is composed of a one-stage CMOS amplifier, amplifies a voltage difference between two input signals input via the positive input terminal VIN+ and the negative input terminal VIN−, and outputs, from the positive output terminal VOUT+ and the negative output terminal VOUT−, according to the voltage difference between the two input signals.

The auxiliary circuit 20 controls an auxiliary bias current flowing through the output terminal VOUT+ and the output terminal VOUT− according to the two input signals input via the input terminal VIN+ and the input terminal VIN−. The auxiliary circuit 20 improves a slew rate of the main amplifier 10 by controlling the auxiliary bias current flowing through the output terminal VOUT+ and the output terminal VOUT−.

The controller 30 outputs an interrupt signal instructing the auxiliary circuit 20 to interrupt the supply of the auxiliary bias current from the auxiliary circuit 20 to the main amplifier 10.

Figure 2:
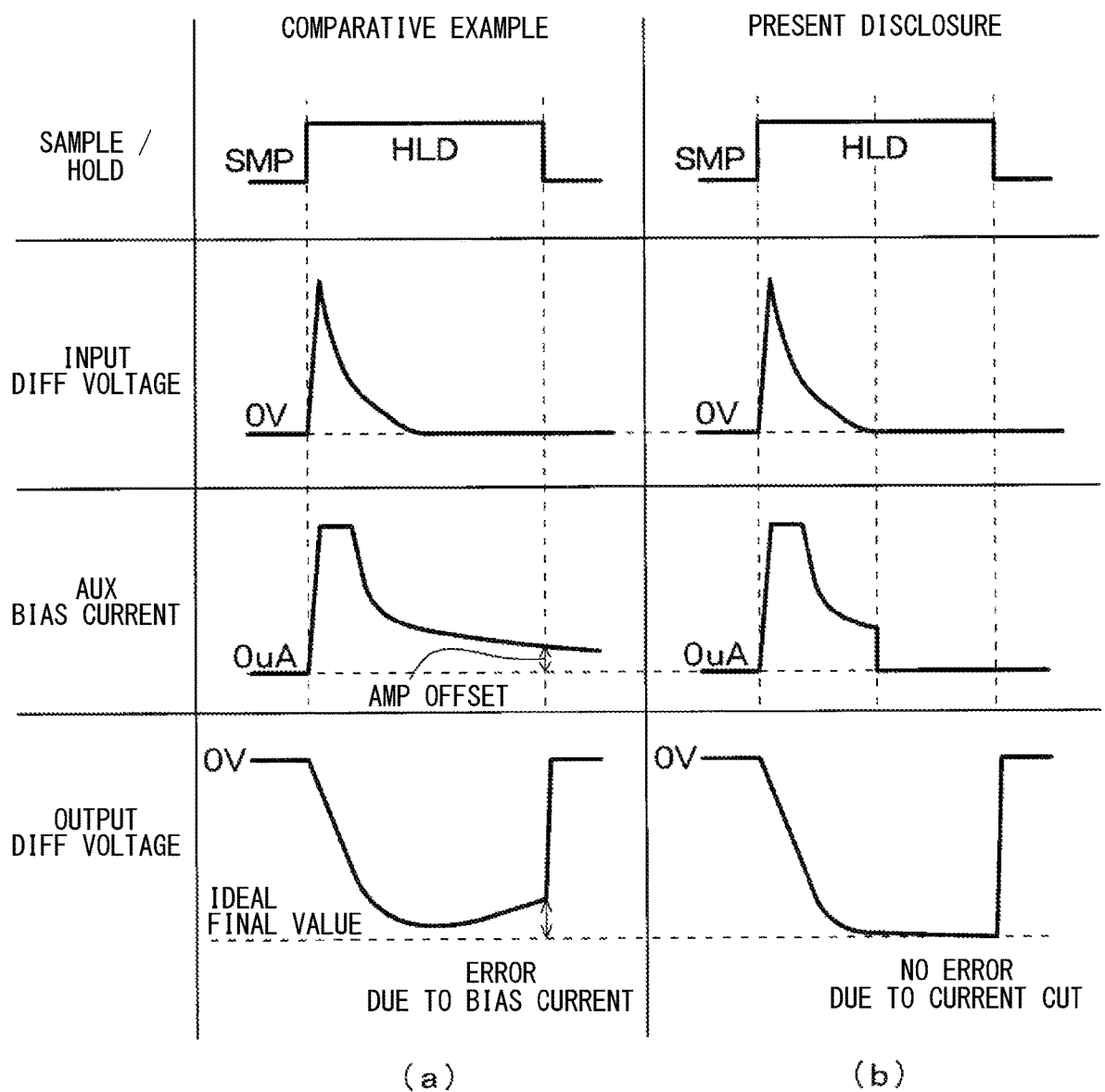
FIG. 2 is a timing chart of (i) a comparative example and (ii) the present disclosure, which is an amplifier circuit of the first embodiment.

In FIG. 2, a column (a) includes timing charts of a comparative example having no function of interrupting the auxiliary bias current flowing through the output terminal VOUT+ and the output terminal VOUT− at a predetermined timing before completion of settling. Note that the only difference in FIG. 2 between the comparative example and the present embodiment is that the comparative example does not have a function of interrupting the auxiliary bias current flowing through the output terminal VOUT+ and the output terminal VOUT− at a predetermined timing before completion of settling, in contrast to the amplifier circuit 1 of the present embodiment. Further, a column (b) includes timing charts of the amplifier circuit 1 of the present embodiment.

First, the timing charts of the comparative example in column (a) of FIG. 2 are described. When the sample-and-hold signal input to the controller 30 from the outside changes from a sample SMP to a hold HLD, the input signals are input from the outside to the input terminal VIN+ and to the input terminal VIN−, respectively.

The main amplifier 10 amplifies the difference between the two input signals input from the input terminal VIN+ and the input terminal VIN−, and outputs an output signal corresponding to the difference between the input signals.

Further, the auxiliary circuit 20 controls the auxiliary bias current flowing through the output terminals VOUT+ and VOUT− in accordance with the difference between the two input signals input from the input terminal VIN+ and the input terminal VIN−.

The waveform of the auxiliary bias current shown in the column (a) of FIG. 2 becomes constant when it increases to a certain (maximum) current value, and then gradually decreases. At the time of such decrease, the waveform of the auxiliary bias current decreases relatively slowly. Further, the waveform of the auxiliary bias current does not return (i.e., does not fall down) to 0 even when the hold stat changes to the sample state, as illustrated by the arrow labeled AMP OFFSET.

It is considered that such a behavior is caused because the auxiliary bias current continues to flow from the auxiliary circuit 20 to the output terminals VOUT+ and VOUT− due to an offset mismatch between the main amplifier 10 and the auxiliary circuit 20. In such case, an error occurs in the output difference voltage output from the output terminals VOUT+ and VOUT−, as illustrated by the arrow labeled ERROR DUE TO BIAS CURRENT.

Next, the timing charts of the amplifier circuit 1 of the present embodiment are described with reference to the ones in the column (b) of FIG. 2. Similar to the comparative example, when the sample-and-hold signal input to the controller 30 from the outside changes from the sample SMP to the hold HLD, the input signals are received by the input terminal VIN+ and the input terminal VIN−, respectively.

The waveform of the auxiliary bias current shown in the column (b) of FIG. 2 becomes constant when it increases to a certain current value, and then gradually decreases. At the time of such decrease, the waveform of the auxiliary bias current decreases relatively slowly.

Here, the auxiliary circuit 20 in the amplifier circuit 1 of the present embodiment interrupts (terminates) the auxiliary bias current flowing through the output terminals VOUT+ and VOUT− in accordance with the interrupt signal output from the controller 30. As a result, the auxiliary bias current flowing through the output terminals VOUT+ and VOUT− is interrupted at a predetermined timing before completion of settling, and the current quickly becomes (i.e., falls down to) 0.

Thus, at a timing of when the hold state ends, the waveform of the auxiliary bias current is 0 (due to the interrupt signal), and the output difference voltage of the output terminals VOUT+ and VOUT− also is 0 (as shown in the bottom of column (b) in FIG. 2). In such manner, the auxiliary bias current is interrupted and the output signal is not affected by the auxiliary bias current, thereby improving the accuracy of the output signal of the main amplifier.

As described above, the amplifier circuit 1 has the main amplifier 10 and the auxiliary circuit 20 for improving the slew rate of the main amplifier 10, and the main amplifier 10 and the auxiliary circuit 20 are connected in parallel to a position between the signal terminals VIN+ and VIN− and the output terminals VOUT+ and VOUT−. Further, the main amplifier 10 is composed of a one-stage CMOS amplifier, amplifies the voltage difference between the two input signals input from the input terminals VIN+ and VIN−, and outputs, from the output terminals VOUT+ and VOUT−, the output signal corresponding to the voltage difference between the input signals. Further, the auxiliary circuit 20 controls the auxiliary bias current flowing through the output terminals VOUT+ and VOUT− according to the voltage difference of the input signals. Then, the auxiliary circuit 20 interrupts (terminates) the auxiliary bias current flowing through the output terminals VOUT+ and VOUT− at a predetermined timing before completion of settling.

According to such a configuration, the auxiliary bias current flowing through the output terminals VOUT+ and VOUT− is interrupted at a predetermined timing before completion of settling, and the output signal is not affected by the auxiliary bias current (after the interruption occurs). Therefore, the accuracy of the output signal in a low power amplifier circuit provided with an auxiliary circuit for improving the slew rate of the main amplifier having the one-stage CMOS amplifier is improvable.

Second Embodiment

The amplifier circuit 1 (not shown in FIG. 3) according to the second embodiment is described with reference to FIGS. 3 to 7. The amplifier circuit 1 of the present embodiment represents a specific configuration of the amplifier circuit 1 of the first embodiment. The amplifier circuit 1 is used in an AD converter that converts an analog signal into a digital signal. Further, the amplifier circuit 1 includes a main amplifier 10, an auxiliary circuit 20, and a controller 30 in the same manner as that shown in FIG. 1.

Figure 3:
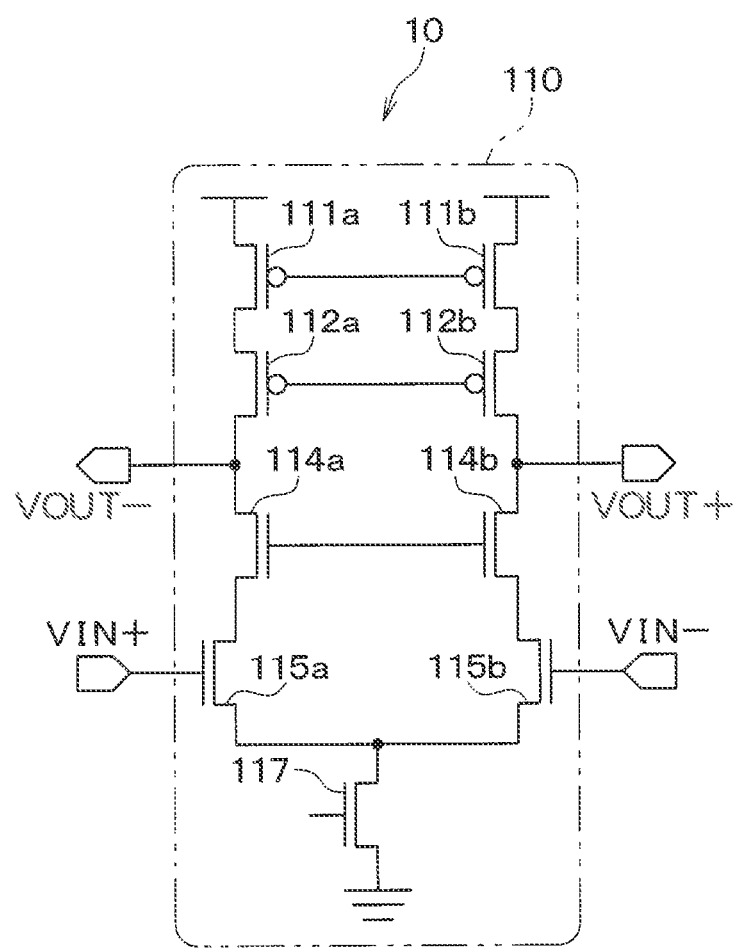
FIG. 3 is a circuit diagram of a main amplifier according to a second embodiment.

The circuit configuration of the main amplifier 10 is described with reference to FIG. 3. The main amplifier 10 includes an amplifier unit 110.

The amplifier unit 110 includes P-type MOSFETs 111a, 111b, 112a, 112b, and N-type MOSFETs 114a, 114b, 115a, 115b, and 117.

The gates of the P-type MOSFET 111a and the P-type MOSFET 111b, and the gates of the P-type MOSFET 112a and the P-type MOSFET 112b are connected to each other. A predetermined bias voltage is applied to each of the gates of the P-type MOSFET 111a and the P-type MOSFET 111b and to each of the gates of the P-type MOSFET 112a and the P-type MOSFET 112b by an external circuit (not shown).

Further, the P-type MOSFET 111a and the P-type MOSFET 112a are cascode-connected between a power supply line VDD and the output terminal VOUT−.

Further, the P-type MOSFET 111b and the P-type MOSFET 112b are cascode-connected between the power supply line VDD and the output terminal VOUT+.

The N-type MOSFET 114a and the N-type MOSFET 115a are cascode-connected between the output terminal VOUT− and a ground line GND. Further, the N-type MOS- FET 114b and the N-type MOSFET 115b are cascode-connected between the output terminal VOUT− and the ground line GND.

The input terminal VIN+ is connected to the gate of the N-type MOSFET 115a, and the signal terminal VIN− is connected to the gate of the N-type MOSFET 115b. Further, the sources of the N-type MOSFET 115a and the N-type MOSFET 115b are connected to each other.

The drain of the N-type MOSFET 117 is connected to each of the sources of the N-type MOSFET 115a and the N-type MOSFET 115b, and the source of the N-type MOSFET 117 is connected to the ground line GND. Although not shown, a predetermined bias voltage is applied to the gate of the N-type MOSFET 117 by an external circuit (not shown).

Next, the operation of the main amplifier 10 is described.

When the potential of the input terminal VIN+ rises and the potential of the input terminal VIN− falls, the drain-source voltage of the N-type MOSFET 115a decreases, and the drain-source voltage of the N-type MOSFET 115b increases. Therefore, the potential of the output terminal VOUT− falls, and the potential of the output terminal VOUT+ rises.

On the contrary, when the potential of the input terminal VIN+ falls and the potential of the input terminal VIN− rises, the drain-source voltage of the N− type MOSFET 115a increases and the drain-source voltage of the N-type MOSFET 115b decreases. Therefore, the potential of the output terminal VOUT− rises, and the potential of the output terminal VOUT+ falls.

In such manner, the main amplifier 10 amplifies the voltage difference between the two input signals input via the input terminal VIN+ and the signal terminal VIN−, and outputs output signals corresponding to the voltage difference between the two input signals from the output terminal VOUT+ and output terminal VOUT−.

Next, the circuit configuration of the auxiliary circuit 20 is described with reference to FIG. 4. Of the signal terminals of FIGS. 3 and 4, the signal terminals having the same name are connected to each other by a connecting line. Specifically, the signal terminals having the same name are the input terminal VIN+, the input terminal VIN−, the output terminal VOUT+, and the output terminal VOUT−.

The auxiliary circuit 20 includes an auxiliary amplifier 210, current mirror circuit units 220, 230, P-type MOSFETs 241, 243, 251, 253, and N-type MOSFETs 242, 244, 252, and 254.

The auxiliary amplifier 210 includes P-type MOSFETs 211 and 212 and N-type MOSFETs 213 and 214.

The gates of the P-type MOSFET 211 and the P-type MOSFET 212 are connected to each other. A predetermined bias voltage is applied to each of the gates of the P-type MOSFET 211 and the P-type MOSFET 212 by an external circuit.

The drain of the N-type MOSFET 213 is connected to the drain of the P-type MOSFET 211. Further, the drain of the N-type MOSFET 214 is connected to the drain of the P-type MOSFET 212.

The input terminal VIN+ is connected to the gate of the N-type MOSFET 213, and the input terminal VIN− is connected to the gate of the N-type MOSFET 214. Further, the sources of the N-type MOSFET 213 and the N-type MOSFET 214 are connected to each other.

The drain of the N-type MOSFET 215 is connected to each of the sources of the N-type MOSFET 213 and the N-type MOSFET 214, and the source of the N-type MOSFET 215 is connected to the ground line GND. Although not shown, a predetermined bias voltage is applied to the gate of the N-type MOSFET 215 by an external circuit (not shown).

The current mirror circuit unit 220 includes P-type MOSFETs 221 and 222 and N-type MOSFET 223.

The gates of the P-type MOSFET 221 and the P-type MOSFET 222 are connected to each other to form a current mirror circuit. A predetermined bias voltage is applied to each of the gates of the P-type MOSFET 221 and the P-type MOSFET 222 by an external circuit. An electric current proportional to the electric current flowing through the P-type MOSFET 222 flows through the P-type MOSFET 221.

The sources of the P-type MOSFET 221 and the P-type MOSFET 222 are connected to the power supply line VDD, and the drain of the P-type MOSFET 222 is connected to the respective gates of the P-type MOSFET 221 and the P-type MOSFET 222.

The N-type MOSFET 223 is connected in series with the P-type MOSFET 221. Specifically, the drain of the N-type MOSFET 223 is connected to the drain of the P-type MOSFET 221 and the source of the N-type MOSFET 223 is connected to the ground line GND.

The current mirror circuit unit 230 has P-type MOSFETs 231 and 232 and N-type MOSFET 233.

The gates of the P-type MOSFET 231 and the P-type MOSFET 232 are connected to each other to form a current mirror circuit. A predetermined bias voltage is applied to each of the gates of the P-type MOSFET 231 and the P-type MOSFET 232 by an external circuit. An electric current proportional to the electric current flowing through the P-type MOSFET 231 flows through the P-type MOSFET 232.

The sources of the P-type MOSFET 231 and the P-type MOSFET 232 are connected to the power supply line VDD, and the drain of the P-type MOSFET 231 is connected to the respective gates of the P-type MOSFET 231 and the P-type MOSFET 232.

The N-type MOSFET 233 is connected in series with the P-type MOSFET 232. Specifically, the drain and gate of the N-type MOSFET 233 are connected to the drain of the P-type MOSFET 232, and the source of the N-type MOSFET 233 is connected to the ground line GND.

The P-type MOSFETs 251 and 253 and the N-type MOSFETs 252 and 254 are bias current MOSFETs that control the bias current flowing through the output terminals VOUT+ and VOUT−. The P-type MOSFETs 251 and 253 and the N-type MOSFETs 252 and 254 control the bias currents I1 to I4 flowing through the output terminals VOUT+ and VOUT−.

Note that the P-type MOSFET 251 corresponds to a first P-type MOSFET, the N-type MOSFET 252 corresponds to a first N-type MOSFET, the P-type MOSFET 253 corresponds to a second P-type MOSFET, and the N-type MOSFET 254 corresponds to a second N-type MOSFET. The gates of the P-type MOSFET 221 and the P-type MOSFET 222 as well as the drain of the P-type MOSFET 241 are connected to the gate of the P-type MOSFET 251.

The gates of the P-type MOSFET 231 and the P-type MOSFET 232 as well as the drain of the P-type MOSFET 243 are connected to the gate of the P-type MOSFET 253.

The drain and gate of the N-type MOSFET 233 as well as the drain of the N-type MOSFET 244 are connected to the gate of the N-type MOSFET 252.

The drain and gate of the N-type MOSFET 223 as well as the drain of the N-type MOSFET 242 are connected to the gate of the N-type MOSFET 254.

The P-type MOSFETs 241 and 243 and the N-type MOSFETs 242 and 244 are control MOSFETs for turning OFF the P-type MOSFETs 251 and 253 and the N-type MOSFETs 252 and 254, which are bias current MOSFETs.

Note that the P-type MOSFET 241 corresponds to a first control P-type MOSFET, and the N-type MOSFET 242 corresponds to a first control N-type MOSFET. Further, the P-type MOSFET 243 corresponds to a second control P-type MOSFET, and the N-type MOSFET 244 corresponds to a second control N-type MOSFET.

A cut signal CUTN (also known as a first interrupt signal or a P-type interrupt signal) is input to the gates of the P-type MOSFET 241 and the P-type MOSFET 243 via signal terminals CUTn. Further, a cut signal CUTP (also known as a second interrupt signal or an N-type interrupt signal) is input to the gates of the N-type MOSFET 242 and the N-type MOSFET 244 via signal terminals CUTp.

The sources of the P-type MOSFET 241 and the P-type MOSFET 243 are connected to the power supply line VDD. Further, the sources of the N-type MOSFET 242 and the N-type MOSFET 244 are connected to the ground line GND.

The controller 30 is composed of a digital circuit. The controller 30 outputs a cut signal instructing an interruption of the auxiliary bias currents I1 to I4 to the auxiliary circuit 20 at a predetermined timing before completion of settling when the fluctuation of the signal output from the amplifier circuit 1 converges. The cut signal includes the cut signal CUTN and the cut signal CUTP. The cut signal CUTN in the low level instructs interruption of the auxiliary bias currents I1 and I3. The cut signal CUTP in the high level instructs interruption of the supply of the auxiliary bias currents I2 and I4.

A sample-and-hold signal is input to the controller 30 from the outside. The controller 30 outputs the cut signal CUTN and the cut signal CUTP at a timing when a predetermined period elapses after the sample-and-hold signal changes from sample to hold. Specifically, the cut signal CUTN and the cut signal CUTP are output at the timing when half of a hold period elapses after the sample-and-hold signal changes from sample to hold.

Next, the operation of the amplifier circuit 1 of the present embodiment is described.

Figure 4:
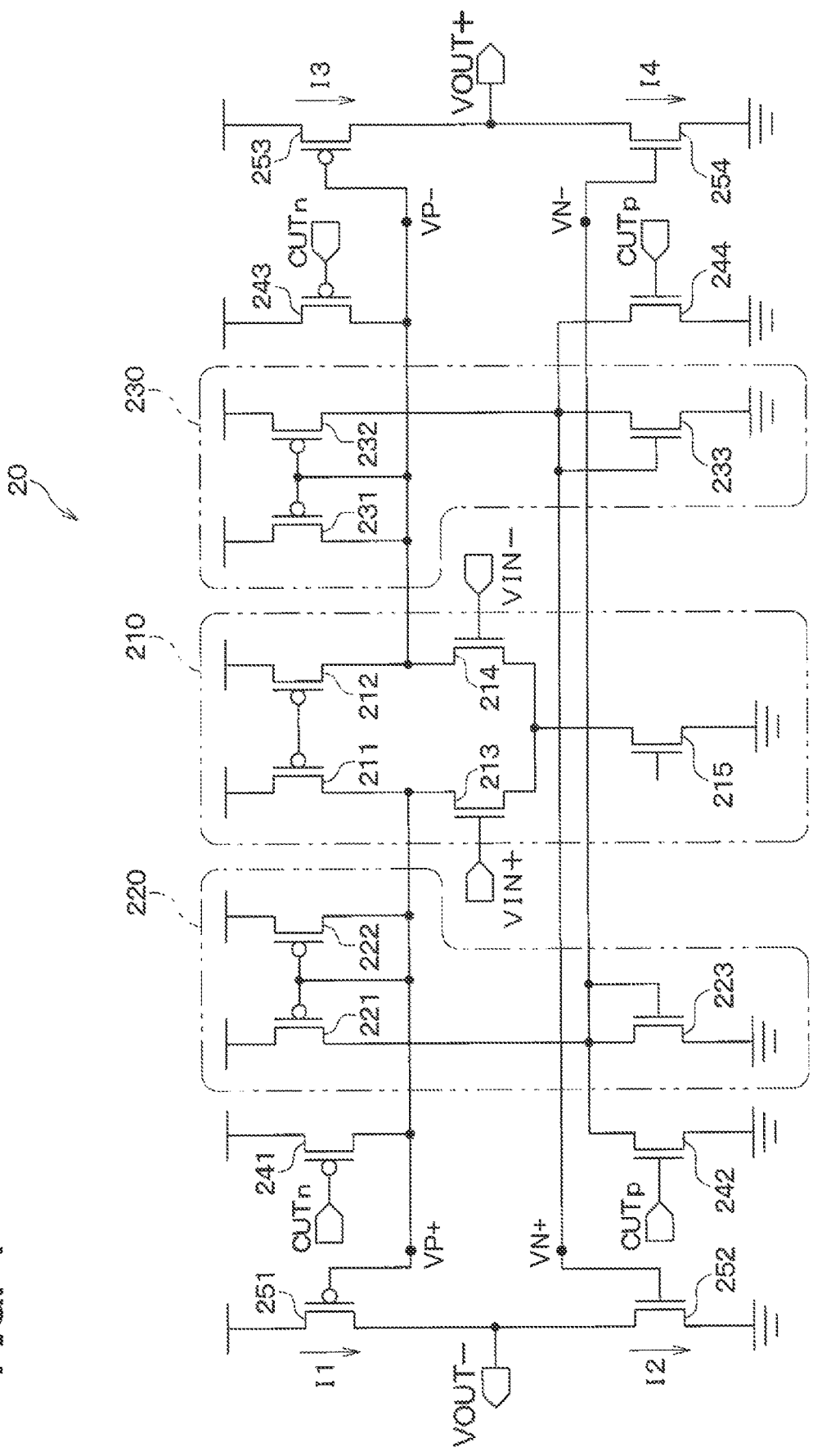
FIG. 4 is a circuit diagram of an auxiliary circuit according to the second embodiment.

First, in the auxiliary circuit 20 shown in FIG. 4, it is assumed that a predetermined drain current flows through the N-type MOSFET 215, and a potential difference between the two signals input to the input terminal VIN+ and the signal terminal VIN− is equal to 0.

Here, when the potential of the input terminal VIN+ rises and the potential of the input terminal VIN− falls, the drain-source voltage of the N-type MOSFET 213 becomes smaller. Therefore, the potential of the gate of the P-type MOSFET 221 and the potential of the gate of the P-type MOSFET 251 fall, respectively, and the auxiliary bias current I1 flowing through the output terminal VOUT− increases.

Further, when the potential of the input terminal VIN+ rises and the potential of the input terminal VIN− falls, the drain-source voltage of the N-type MOSFET 214 increases. Therefore, the potential of the gate of the P-type MOSFET 232 and the potential of the gate of the P-type MOSFET 253 rise, respectively, and the auxiliary bias current I3 flowing through the output terminal VOUT+ decreases.

Further, an equal amount of electric current flows through the P-type MOSFET 222 and the P-type MOSFET 221. Further, an equal amount of electric current flows through the P-type MOSFET 231 and the P-type MOSFET 232.

The N-type MOSFET 223 has a diode connection (not shown) in which the drain and the gate are connected. Therefore, when an electric current flows through the N-type MOSFET 223 via the P-type MOSFET 221, the potential of the gate of the N-type MOSFET 223 converges to a certain value, and a predetermined drain current flows through the N-type MOSFET 223. Then, when the potential of the gate of the P-type MOSFET 221 falls, the potential of the drain of the P-type MOSFET 221 rises, the gate potential of the N-type MOSFET 254 rises, and the auxiliary bias current I4 flowing through the output terminal VOUT+ increases.

Further, the N-type MOSFET 233 has a diode connection (not shown) in which the drain and the gate are connected. Therefore, when an electric current flows through the N-type MOSFET 233 via the P-type MOSFET 232, the potential of the gate of the N-type MOSFET 233 converges to a certain value, and a predetermined drain current flows through the N-type MOSFET 233. Then, when the potential of the gate of the P-type MOSFET 232 rises, the potential of the drain of the P-type MOSFET 232 falls, the potential of the gate of the N-type MOSFET 252 falls, and the auxiliary bias current I2 flowing through the output terminal VOUT− decreases.

As described above, in the auxiliary circuit 20 shown in FIG. 4, when the potential of the input terminal VIN+ rises and the potential of the input terminal VIN− falls, the auxiliary bias current I1 flowing through the P-type MOSFET 251 increases and the auxiliary bias current I2 flowing through the N-type MOSFET 252 decreases. As a result, the potential of the output terminal VOUT− in the main amplifier 10 shown in FIG. 3 tends to rise further.

Further, in the auxiliary circuit 20 shown in FIG. 4, when the potential of the input terminal VIN+ rises and the potential of the input terminal VIN− falls, the auxiliary bias current I3 flowing through the P-type MOSFET 253 decreases, and the auxiliary bias current I4 flowing through the N-type MOSFET 254 increases. As a result, in the main amplifier 10 shown in FIG. 3, the potential of the output terminal VOUT+ tends to fall further.

In such manner, the auxiliary bias currents I1 to I4 corresponding to the signal from the auxiliary circuit 20 flow through the output terminal VOUT+ and the output terminal VOUT−. These auxiliary bias currents I1 to I4 assist the operation of the output terminal VOUT+ and the output terminal VOUT− of the main amplifier 10, enabling further high-speed operation.

However, if there is an offset mismatch between the main amplifier 10 and the auxiliary circuit 20, the auxiliary bias currents I1 to I4 continue to be supplied to the output terminal VOUT+ and the output terminal VOUT− even after the settling of the output signal of the main amplifier 10 is complete. Therefore, the accuracy of the output signal of the main amplifier 10 deteriorates.

Therefore, the amplifier circuit 1 generates the cut signals CUTN and CUTP from the controller 30 at a predetermined timing before completion of settling (for example, at a midpoint timing of the hold period). Therefore, the auxiliary bias currents I1 to I4 are interrupted by turning on the P-type MOSFETs 241 and 243 and the N-type MOSFETs 242 and 244 of the auxiliary circuit 20, respectively.

The P-type MOSFETs 241 and 243 are turned ON when a low-level cut signal CUTN is input. Further, the N-type MOSFETs 242 and 244 are turned ON when a high-level cut signal CUTP is input.

When the P-type MOSFETs 241 and 243 and the N-type MOSFETs 242 and 244 are turned ON, the potentials of the signal terminals VP+ and VP− become respectively equal to the potentials of the power supply line VDD, and the potentials of the signal terminals VN+ and VN− become respectively equal to the potential of the ground line GND.

As a result, the P-type MOSFET 251 and the N-type MOSFET 252, the P-type MOSFET 253, and the N-type MOSFET 254 are respectively turned OFF at a predetermined timing before completion of settling. Therefore, the auxiliary bias currents I1 to I4 flowing through the are interrupted, and no bias current (zero current) is provided by the auxiliary circuit 20.

In such manner, in the auxiliary circuit 20, the P-type MOSFETs 241 and 243 and the N-type MOSFETs 242 and 244 are turned ON according to the cut signals CUTN and CUTP output from the controller 30, respectively. Then, the auxiliary bias currents I1 to I4 are interrupted, and no bias current (zero current) is provided by the auxiliary circuit 20.

Figure 5:
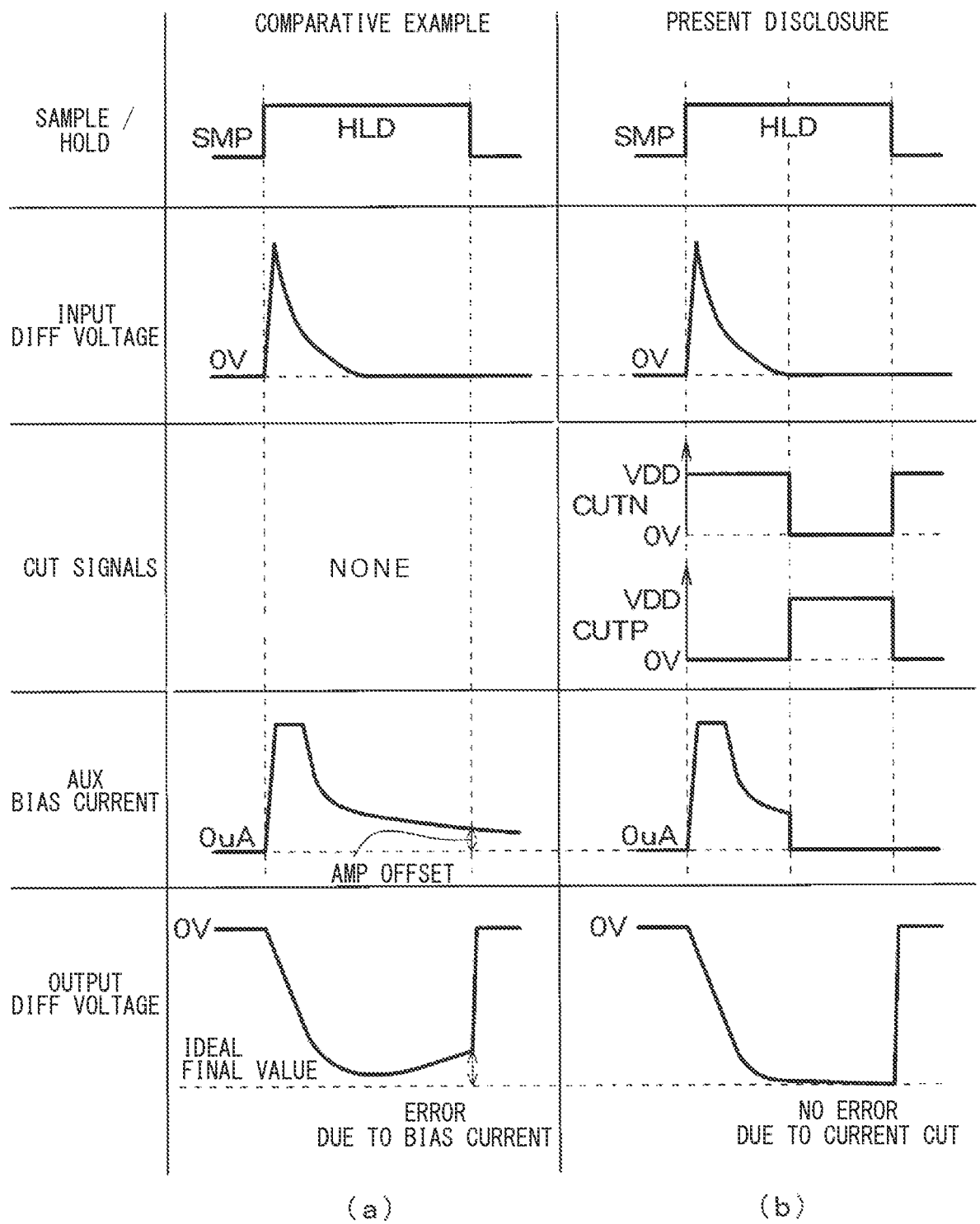
FIG. 5 is a timing chart of the present disclosure, which is the amplifier circuit of a comparative example and the second embodiment.

A column (a) of FIG. 5 includes timing charts of a comparative example having no function of turning OFF the P-type MOSFET 251, the N-type MOSFET 252, the P-type MOSFET 253, and the N-type MOSFET 254 of the auxiliary circuit 20. Further, a column (b) of FIG. 5 includes timing charts of the amplifier circuit 1 of the present embodiment.

First, since the timing charts of the comparative example of the column (a) of FIG. 5 are the same as those of FIG. 2 (a), the description thereof is omitted.

The timing charts of the amplifier circuit 1 of the present embodiment are described with reference to FIG. 5. The auxiliary bias current in FIG. 5 represents I1+I4−(I3+I2) shown in FIG. 3. Similar to the comparative example, when the sample-and-hold signal input to the controller 30 from the outside changes from the sample SMP to the hold HLD, the input signals are input from the outside to the input terminal VIN+ and the input terminal VIN−, respectively. Then, when the input difference voltage of the input signal becomes large, the auxiliary bias currents I1 to I4 flow through the P-type MOSFETs 251 and 253 and the N-type MOSFETs 252 and 254 of the auxiliary circuit 20.

The waveform of the auxiliary bias current shown in the column (b) of FIG. 5 becomes constant when it increases to a certain current value, and then gradually decreases. At the time of such decrease, the waveform of the auxiliary bias current decreases relatively slowly.

Here, in the amplifier circuit 1 of the present embodiment, the cut signals (interrupt signals) CUTP and CUTN are input from the controller 30 to the auxiliary circuit 20. The signal levels of the cut signals CUTP and CUTN are inverted at a predetermined timing before completion of settling. Specifically, the cut signals CUTP and CUTN are configured to have the inverted signal levels when a predetermined period elapses after the sample-and-hold signal changes from the sample SMP to the hold HLD.

When the cut signals CUTP and CUTN are input from the controller 30, the auxiliary circuit 20 interrupts the auxiliary bias currents I1 to I4. As a result, the auxiliary bias currents I1 to I4 flowing through the output terminals VOUT+ and VOUT− are interrupted at a predetermined timing before completion of settling, and quickly become (i.e., fall to) 0.

Then, the waveforms of the auxiliary bias currents I1 to I4 are equal to 0 even at a timing of when the hold state ends, and the output difference voltages of the output terminals VOUT+ and VOUT− also become 0. In such manner, since the auxiliary bias currents I1 to I4 are interrupted and the output signal is not affected by the auxiliary bias currents I1 to I4, the accuracy of the output signal of the main amplifier 10 is improved.

Figure 6:
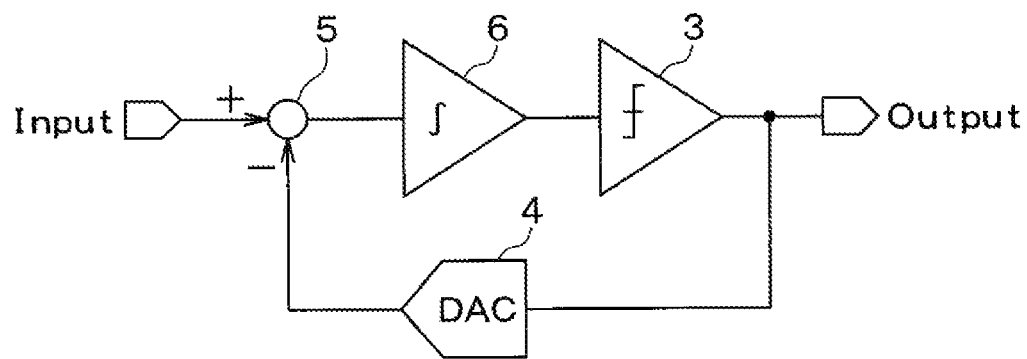
FIG. 6 is a block diagram of a first-order $\Delta\Sigma$ AD converter using an amplifier circuit of the second embodiment.

The amplifier circuit 1 described above can be applied to, for example, a first-order ΔΣ AD converter using a switched capacitor integrator. A first-order ΔΣ AD converter using a switched capacitor integrator 6 is described with reference to FIG. 6. Although it is shown in FIG. 6 that one input signal is input from one input terminal Input, the difference voltage between two input signals is actually input. An "ΔΣ AD converter" is an AD converter for providing digital filter for an output from ΔΣ modulator (not illustrated) and for obtaining high-resolution digital output. ΔΣ modulation is a kind of pulse modulation, and is made up from an integrator, a comparator, and a DA converter. ΔΣ modulator is capable of obtaining comparator output as ΔΣ modulation output, by integrating input by the integrator, digital-converting the integrated output, and adding/subtracting to/from an input signal by using a DA converter according to the output of the integrated-converted input. With such an operation, noise-shaping of power-spectrum density distribution regarding quantum error that is output from the comparator is achievable, as well as improving dynamic range of passband The first-order ΔΣ AD converter includes the switched capacitor integrator 6, a comparator 3, a DA converter 4, and a subtractor 5. The circuit shown in FIG. 5 is configured as a first-order ΔΣ AD converter having a switched capacitor integrator 6 as one integrator. The switched capacitor integrator 6 corresponds to a switched capacitor circuit.

The subtractor 5 subtracts a value of the digital signal output from the DA converter 4 from a value of the analog input signal input from the input terminal Input, and outputs a subtracted result to the switched capacitor integrator 6.

The switched capacitor integrator 6 integrates the signal from the subtractor 5. That is, the switched capacitor integrator 6 integrates by adding the results of subtraction by the subtractor 5 one after another. Then, the result of the integration is output to the comparator 3.

The comparator 3 is a comparator that compares the result integrated by the switched capacitor integrator 6 with a certain value. The comparator 3 compares the result integrated by the switched capacitor integrator 6 with a predetermined reference voltage and quantizes it. Then, the quantized signal is output from the output terminal Output, i.e., is output to the DA converter 4.

The DA converter 4 converts the digital signal from the comparator 3 into an analog signal, and outputs the analog signal to the subtractor 5. The DA converter 4 is configured as a three-level capacitive DA converter.

By repeating the above subtraction, addition, and comparison, a sequence of digital values 1 or 0 is output from the output terminal Output.

Next, the switched capacitor integrator 6 and the DA converter 4 using the amplifier circuit 1 of the present embodiment is described with reference to FIG. 7.

The switched capacitor integrator 6 includes the above-described amplifier circuit 1, a first input capacitor 661, a second input capacitor 671, capacitors 662, 672, a first feedback capacitor 681, and a second feedback capacitor 682. Further, the switched capacitor integrator 6 includes a first switch 611, a second switch 641, a third switch 621, a fourth switch 651, a fifth switch 631, a sixth switch 632, a seventh switch 633, and an eighth switch 634.

The switched capacitor integrator 6 further includes a ninth switch 642, a tenth switch 644, an eleventh switch 643, a twelfth switch 652, a thirteenth switch 654, and a fourteenth switch 653. Although not shown, the switched capacitor integrator 6 has digital circuits that control each of the switches 611 to 614, 621 to 624, 631 to 634, 641 to 644, and 651 to 654.

The first switch 611 is connected between a first input terminal SCIN− and one end of the first input capacitor 661. The second switch 641 is connected between the other end of the first input capacitor 661 and an inverting input terminal of the main amplifier 10.

The third switch 621 is connected between the second input terminal SCIN+ and one end of the second input capacitor 671. The fourth switch 651 is connected between the other end of the second input capacitor 671 and the non-inverting input terminal of the main amplifier 10.

The fifth switch 631 is connected between one end of the first input capacitor 661 and a common mode voltage terminal VCM. The sixth switch 632 is connected between the other end of the first input capacitor 661 and the common mode voltage terminal VCM.

The seventh switch 633 is connected between one end of the second input capacitor 671 and the common mode voltage terminal VCM. The eighth switch 634 is connected between the other end of the second input capacitor 671 and the common mode voltage terminal VCM.

Further, one end of the first feedback capacitor 681 is connected to the input terminal VIN− of the amplifier circuit 1, and one end of the second feedback capacitor 682 is connected to the input terminal VIN− of the amplifier circuit 1.

The ninth switch 642 is connected between one end of the first feedback capacitor 681 and the common mode voltage terminal VCM. The tenth switch 644 is connected between the other end of the first feedback capacitor 681 and the common mode voltage terminal VCM. The eleventh switch 643 is connected between the other end of the first feedback capacitor 681 and the signal output terminal SCOUT+.

The twelfth switch 652 is connected between one end of the second feedback capacitor 682 and the common mode voltage terminal VCM. The thirteenth switch 654 is connected between the other end of the second feedback capacitor 682 and the common mode voltage terminal VCM. The fourteenth switch 653 is connected between the other end of the second feedback capacitor 682 and the signal output terminal SCOUT−.

The DA converter 4 is configured as a three-level capacitive DA converter having a common mode voltage VCM, a P-side reference voltage VREFP, and an M-side reference voltage VREFM.

The DA converter 4 has switches 612, 613, 614, 622, 623, 624.

The switches 612, 613, 614 and the switches 622, 623, 624 are selectively turned ON according to the output signal of the comparator 3 shown in FIG. 6.

Figure 7:
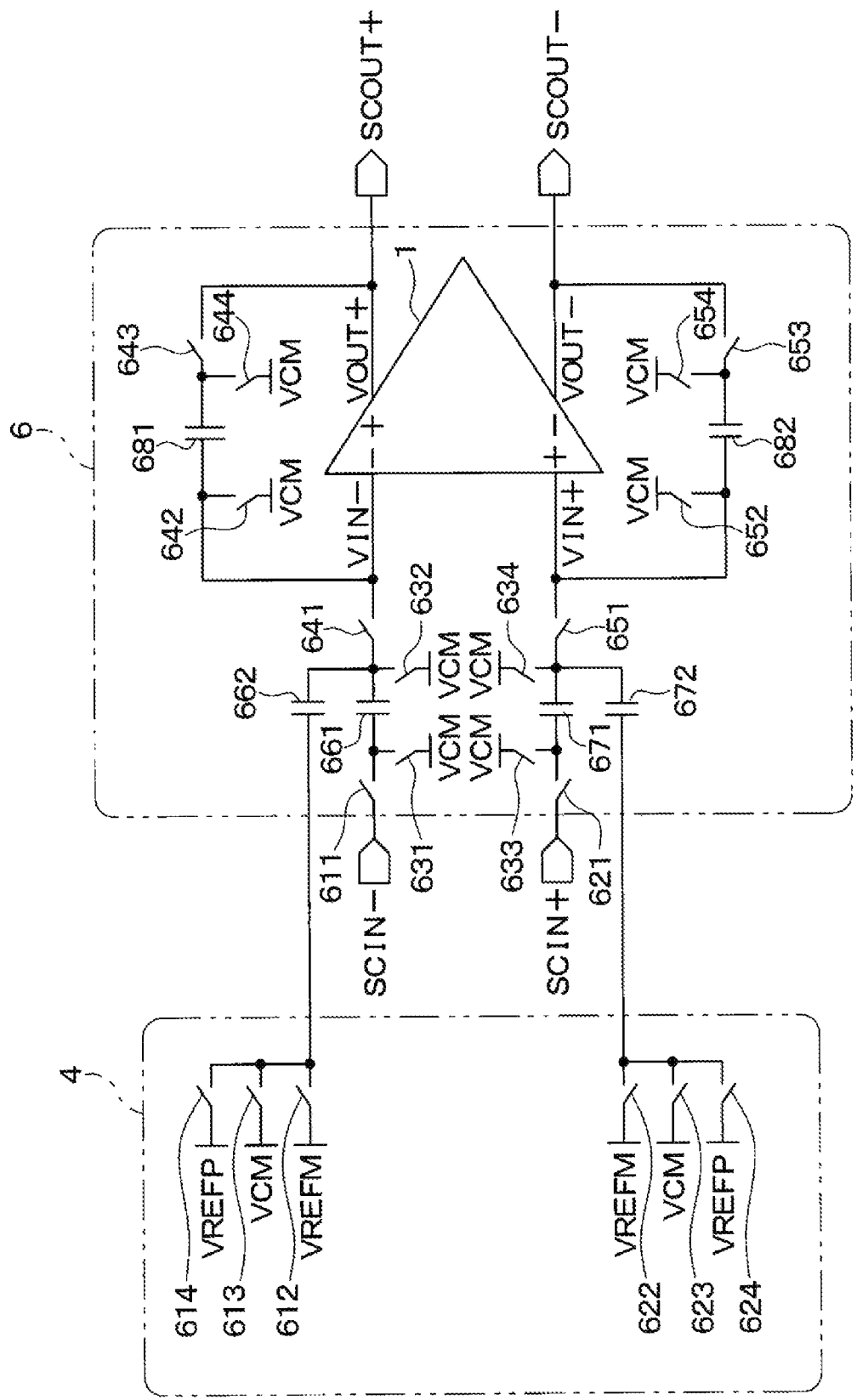
FIG. 7 is a circuit diagram of a switched capacitor integrator, a subtractor, and a DA converter of the first-order $\Delta\Sigma$ AD converter in FIG. 6.

Next, the operation of the circuit shown in FIG. 7 is described.

In an initial state, it is assumed that the switches 642 and 644 are ON and the switches other than the switches 642 and 644 are OFF. When the switches 642 and 644 are turned ON, the charges of the feedback capacitors 681 and 682 are discharged. At such timing, the input terminal VIN− and the input terminal VIN+ of the amplifier circuit 1 have the same potential as the common mode voltage terminal VCM, respectively.

First, the controller 30 turns OFF the switches 642 and 644 and turns ON the switches 611, 632, 621 and 634 when a predetermined period has elapsed from the initial state. As a result, electric charges are accumulated in the first and second input capacitors 661 and 671 according to the input signals input from the input terminals SCIN− and the input terminals SCIN+.

Further, one of the switches 612 to 614 is turned ON and one of the switches 622 to 624 is turned ON according to the output signal of the comparator 3. As a result, electric charges are accumulated in the capacitors 662 and 672.

Next, when a predetermined period further elapses thereafter, the controller 30 turns OFF the switches 611, 632, 621, 634 and turns ON the switches 631, 633, 641, 651, 643, 653.

As a result, a part of the electric charge accumulated in the input capacitors 661 and 662 moves to the feedback capacitor 681, and a part of the electric charge accumulated in the input capacitors 671 and 672 moves to the feedback capacitor 682. Further, the signal terminal VIN− of the amplifier circuit 1 has (i.e., receives) an input of a subtraction result subtracting (i) a value of the digital signal output from the DA converter 4 from (ii) a value of the analog input signal input from the input terminal SCIN−. Further, the result of subtracting the value of the digital signal output from the DA converter 4 from the value of the analog input signal input from the input terminal SCIN+ is input to the input terminal VIN+ of the amplifier circuit 1.

Next, when the predetermined period elapses thereafter, the controller 30 turns ON the switches 642 and 644 again and turns OFF the switches other than the switches 642 and 644. As a result, the electric charge accumulated in the feedback capacitors 681 and 682 is discharged.

In such manner, the controller 30 switches the switches 611 to 614, 621 to 624, 631 to 634, 641 to 644, and 651 to 654 so as to charge the input capacitors 661 and 662 and the feedback capacitors 681 and 682.

In such manner, the switched capacitor integrator 6 provided with the amplifier circuit 1 described above may be configured. Further, the first-order ΔΣ AD converter including the above-mentioned switched capacitor integrator 6 may be configured.

As described above, the amplifier circuit 1 includes the main amplifier 10, the auxiliary circuit 20 for improving the slew rate of the main amplifier 10, and the controller 30. Further, the main amplifier 10 and the auxiliary circuit 20 are connected in parallel between the signal terminals VIN+ and VIN− and the output terminals VOUT+ and VOUT−.

Further, the main amplifier 10 is composed of a one-stage CMOS amplifier, amplifies the voltage difference between the two input signals input from the input terminals VIN+ and VIN−, and outputs, from the output terminals VOUT+ and VOUT−, the output signal corresponding to the voltage difference between the input signals.

Further, the auxiliary circuit 20 controls the auxiliary bias currents I1 to I4 flowing through the output terminals VOUT+ and VOUT− according to the difference in the voltage of the input signal. Then, when the cut signals CUTN and CUTP are input from the controller 30, the auxiliary circuit 20 interrupts the auxiliary bias current flowing through the output terminals.

According to such a configuration, when a cut signal is input from the controller 30, the auxiliary bias currents I1 to I4 are interrupted, and the output signal is not affected by the auxiliary bias currents I1 to I4, thereby enabling improvement of the accuracy of the output signal of the main amplifier.

As described above, the amplifier circuit 1 of the present embodiment includes a controller 30 that outputs cut signals (interrupt signals) CUTN and CUTP instructing interruption of the flow of the auxiliary bias currents I1 to I4 to the output terminals. Note, a single interrupt signal may be output from the controller, and a second (logical inverse) signal may be generated in the auxiliary circuit by an inverter (not shown).

Therefore, the auxiliary bias currents I1 to I4 can be interrupted at the timing corresponding to the cut signals CUTN and CUTP output from the controller 30.

Further, the amplifier circuit 1 of the present embodiment includes an auxiliary circuit 20 that controls the auxiliary bias currents I1 to I4 according to the difference in the voltage of the input signal. Further, when the cut signals CUTN and CUTP are input from the controller 30, the auxiliary circuit 20 interrupts the auxiliary bias currents I1 to I4.

In such manner, the auxiliary bias currents I1 to I4 are interrupted (a) not by providing a new switch/switches en route of the flow of (i.e., in a path of) the auxiliary bias currents I1 to I4 and controlling the new switch, but (b) by the control described above.

Therefore, it is possible to eliminate an error due to noise generated when controlling a plurality of switches arranged in the path through which the auxiliary bias currents I1 to I4 flow.

Further, the amplifier circuit has an output terminal OUT+ as a positive output terminal and an output terminal OUT− as a negative output terminal. Further, the auxiliary circuit 20 has a P-type MOSFET 251 that is connected to the output terminal OUT− and controls the auxiliary bias current I1 flowing to the output terminal OUT−. Further, the auxiliary circuit 20 has an N-type MOSFET 252 that is connected to the output terminal OUT− and controls the auxiliary bias current I2 flowing from the output terminal OUT−.

Further, the auxiliary circuit 20 has the P-type MOSFET 253 that is connected to the output terminal OUT+ and controls the auxiliary bias current I3 flowing to the output terminal OUT+. Further, the auxiliary circuit 20 has a second N-type MOSFET 254 connected to the output terminal OUT+ and controlling the auxiliary bias current I4 flowing from the output terminal OUT+.

Then, when the cut signals CUTN and CUTP are input from the controller 30 to the auxiliary circuit 20, the plurality of transistors, i.e., the P-type MOSFET 251 and the N-type MOSFET 252, the P-type MOSFET 253 and the N-type MOSFET 254 are turned OFF.

Further, the auxiliary circuit 20 has the P-type MOSFET 241 (i) arranged between the power supply line VDD and the gate of the P-type MOSFET 251 and (ii) for turning OFF the P-type MOSFET 251. Further, the auxiliary circuit 20 has the N-type MOSFET 242 (i) arranged between the gate of the N-type MOSFET 254 and the ground line GND and (ii) for turning OFF the N-type MOSFET 254.

Further, the auxiliary circuit 20 has the P-type MOSFET 243 (i) arranged between the power supply line VDD and the P-type MOSFET 253 and (ii) for turning OFF the P-type MOSFET 253. Further, the auxiliary circuit 20 has the N-type MOSFET 244 (i) arranged between the gate of the N-type MOSFET 252 and the ground line GND and (ii) for turning OFF the N-type MOSFET 252.

Then, when the cut signals CUTN and CUTP are input from the controller 30, the P-type MOSFETs 241 and 243 and the N-type MOSFETs 242 and 244 turn OFF the plurality of bias current MOSFETs.

By turning OFF the plurality of bias current MOSFETs by the plurality of control MOSFETs in such manner, the flow of the auxiliary bias currents I1 to I4 flowing to or from the output terminals VOUT+ and VOUT− can be interrupted.

Further, the predetermined timing before the completion of settling is a timing synchronized with the sample-and-hold signal input from the outside.

In such manner, the auxiliary bias currents I1 to I4 flowing to or from the output terminals VOUT+ and VOUT− can be interrupted at a timing synchronized with the sample-and-hold signal input from the outside.

Further, the amplifier circuit 1 of the present embodiment can be used for a switched capacitor circuit, and can also be used for a ΔΣ type, oversampling type AD converter.

Third Embodiment

Figure 8:
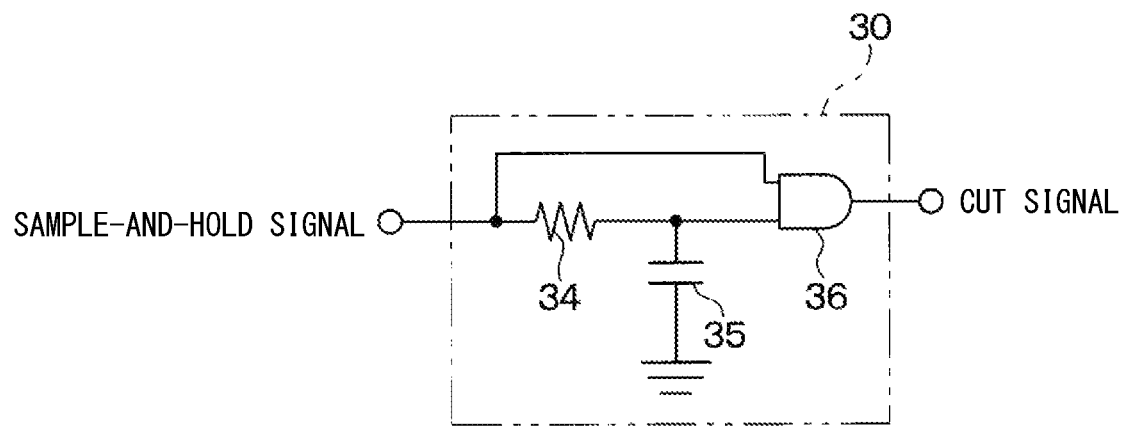
FIG. 8 is a circuit diagram of a controller of an amplifier circuit according to a third embodiment.

The amplifier circuit 1 according to the third embodiment is described with reference to FIG. 8. The amplifier circuit 1 of the present embodiment has a different configuration of the controller 30 as compared with the amplifier circuit 1 of the first to second embodiments.

The controller 30 of the present embodiment generates the cut signals CUTN and CUTP from an external sample-and-hold signal. The controller 30 has a resistor 34, a capacitor 35, and an AND circuit 36. An RC low-pass filter is composed of the resistor 34 and the capacitor 35.

A sample-and-hold signal is input directly to one of the input terminals of the AND circuit 36, and a sample-and-hold signal after having passed through the RC low-pass filter composed of the resistor 34 and the capacitor 35 is input to the other one of the input terminals of the AND circuit 36.

The operation of the controller 30 is described.

First, when the sample-and-hold signal changes from low level to high level, the potential of one input terminal of the AND circuit 36 becomes high level. Further, the other input terminal of the AND circuit 36 becomes a low level because the capacitor 35 has not been sufficiently charged yet, and a low level signal is output from the AND circuit 36. Next, when the capacitor 35 is charged and the other input terminal of the AND circuit 36 reaches a high level, a high level signal is output from the AND circuit 36. Next, when the sample-and-hold signal changes from high level to low level, the potential of one input terminal of the AND circuit 36 becomes low level. Further, the capacitor 35 is discharged and the other input terminal of the AND circuit 36 becomes a low level. Therefore, a low level signal is output from the AND circuit 36.

Therefore, the output signal of the controller 30 has a waveform that rises slightly later than (i.e., delayed from) the rise of the sample-and-hold signal.

By the way, the cut signals CUTN and CUTP can be generated by inputting an opposite phase edge of the 4× speed clock of the sample-and-hold signal to a CLK terminal of a D flip-flop circuit. However, in such a configuration, the circuit area size becomes large (i.e., the circuit may occupy large area on the substrate).

On the other hand, since the controller 30 of the present embodiment can generate the cut signals CUTN and CUTP with such a simple configuration, the cut signals CUTN and CUTP are generatable without requiring a double-speed clock circuit and have a small circuit area size.

Fourth Embodiment

Figure 9:
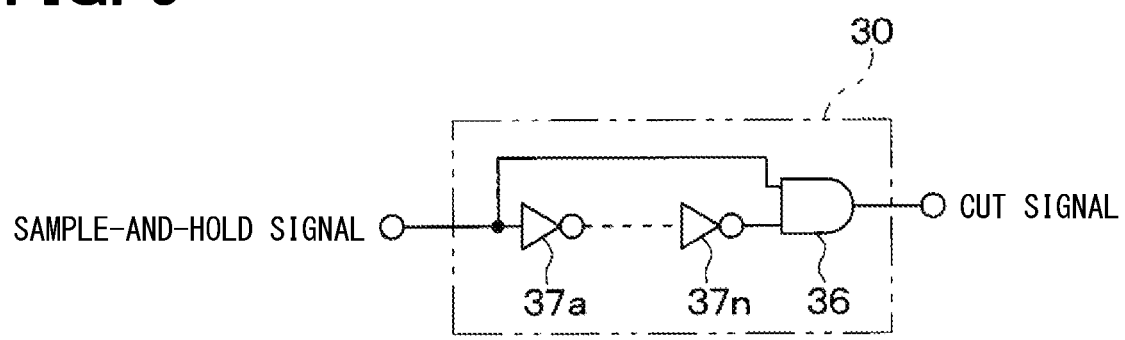
FIG. 9 is a circuit diagram of a controller of an amplifier circuit according to a fourth embodiment.

The amplifier circuit 1 according to the fourth embodiment is described with reference to FIG. 9. The amplifier circuit 1 of the present embodiment has a different configuration of the controller 30 as compared with the amplifier circuit 1 of the first to third embodiments.

The controller 30 of the present embodiment also generates the cut signals CUTN and CUTP from the sample-and-hold signal from the outside. The controller 30 has inverter circuits 37a, . . . 37n, and the AND circuit 36, which are connected in multiple stages.

A sample-and-hold signal is directly input to one of the input terminals of the AND circuit 36, and a sample-and-hold signal after having passed through the inverter circuits 37a, . . . 37n connected in multiple stages is input to the other one of the input terminals of the AND circuit 36 as a delayed signal.

The operation of the controller 30 is described.

First, when the sample-and-hold signal changes from low level to high level, the potential of one input terminal of the AND circuit 36 becomes high level. Further, the other input terminal of the AND circuit 36 becomes low level due to the delay. Therefore, a low level signal is output from the AND circuit 36.

Next, when the time required for the sample-and-hold signal to pass through the multi-stage connected inverter circuits 37a, . . . 37n elapses and the other input terminal of the AND circuit 36 reaches a high level, the AND circuit 36 outputs a signal in high level.

Next, when the sample-and-hold signal changes from high level to low level, the potential of one input terminal of the AND circuit 36 becomes low level, and the potential of the other input terminal of the AND circuit 36 becomes high level, and the AND circuit 36 outputs a signal in low level.

Therefore, the output signal of the controller 30 has a waveform that rises slightly later than (i.e., that rises slightly delayed from) the rise of the sample-and-hold signal.

Similar to the third embodiment, the controller 30 of the present embodiment can generate the cut signals CUTN and CUTP with a simple configuration, i.e., with a smaller circuit area size and without requiring a double speed clock circuit.

Fifth Embodiment

Figure 10:
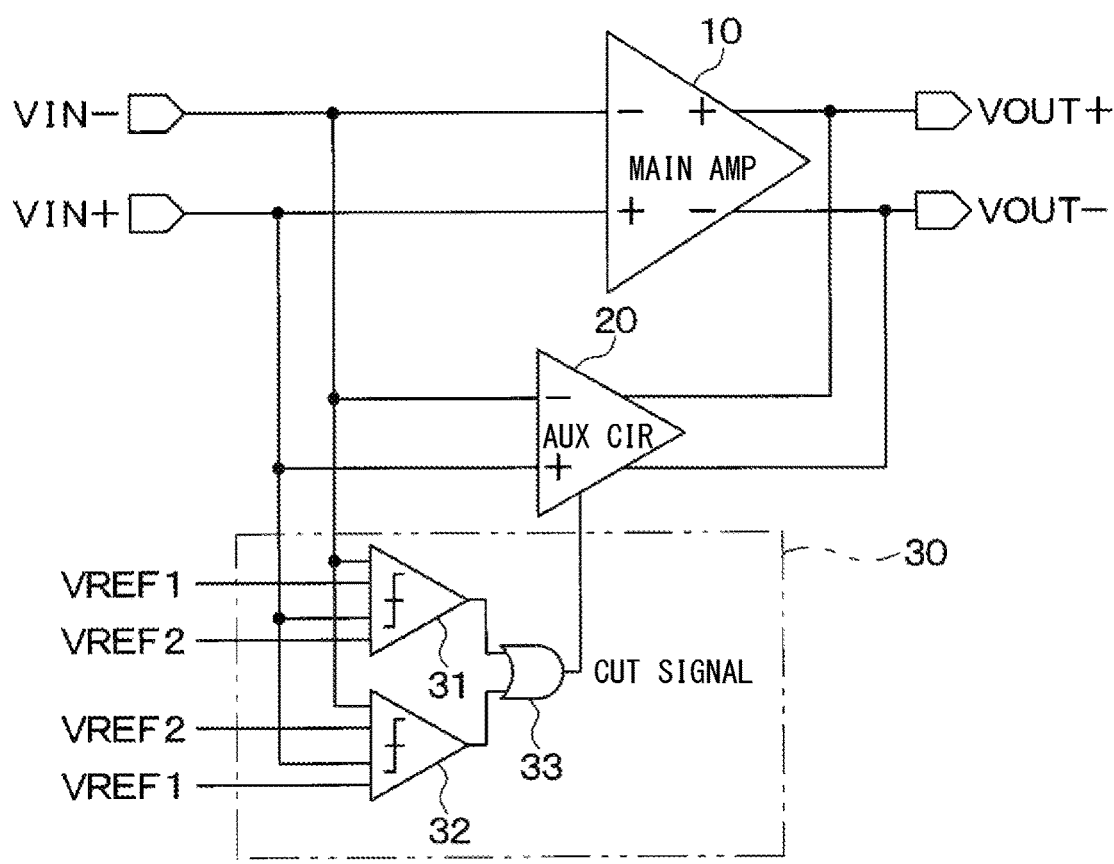
FIG. 10 is a diagram showing an overall configuration of an amplifier circuit according to a fifth embodiment.

The amplifier circuit 1 according to the fifth embodiment is described with reference to FIG. 10. The amplifier circuit 1 of the present embodiment has a different configuration of the controller 30 than the amplifier circuit 1 of the first embodiment.

The amplifier circuit 1 of the present embodiment outputs the cut signals CUTN and CUTP from the controller 30 to the auxiliary circuit 20 at a timing when the difference voltage between the two input signals to the main amplifier 10 is within a predetermined range, and interrupts the auxiliary bias currents I1 to I4 flowing through OUT+ and OUT−.

The controller 30 of the present embodiment includes comparators 31, 32 and an OR circuit 33.

When the difference voltage between the two input signals takes a positive value, the comparator 31 compares the difference voltage with another difference voltage obtained by subtracting a threshold voltage VREF2 from a threshold voltage VREF1. Here, the threshold voltage VREF1 has a larger value than the threshold voltage VREF2. The comparator 31 outputs a high-level signal when the magnitude of the difference voltage between the two input signals is smaller than the threshold voltage VREF1− the threshold voltage VREF2.

When the difference voltage between the two input signals takes a negative value, the comparator 32 compares the difference voltage with another difference voltage obtained by subtracting the threshold voltage VREF1 from the threshold voltage VREF2. The comparator 32 outputs a high-level signal when the magnitude of the difference voltage between the two input signals is smaller than the threshold voltage VREF2− the threshold voltage VREF1.

The OR circuit 33 outputs a logical sum of the comparator 31 and the comparator 32 to the auxiliary circuit 20 as the cut signal CUTP, and outputs, to the auxiliary circuit 20, a cut signal COUN in which the logic of the cut signal CUTP is inverted.

As described above, the controller 30 can be configured by using the comparators 31, 32 and the OR circuit 33.

Sixth Embodiment

Figure 11:
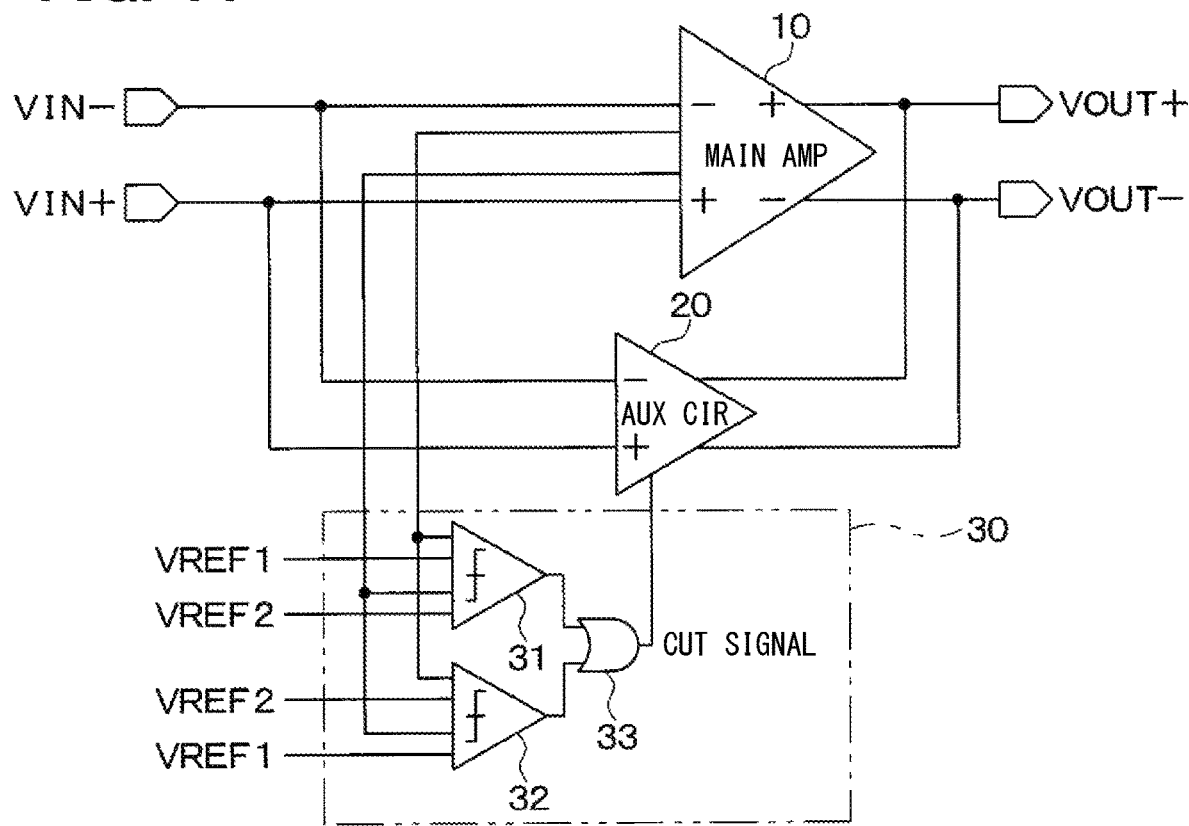
FIG. 11 is a diagram showing an overall configuration of an amplifier circuit according to a sixth embodiment.
Figure 12:
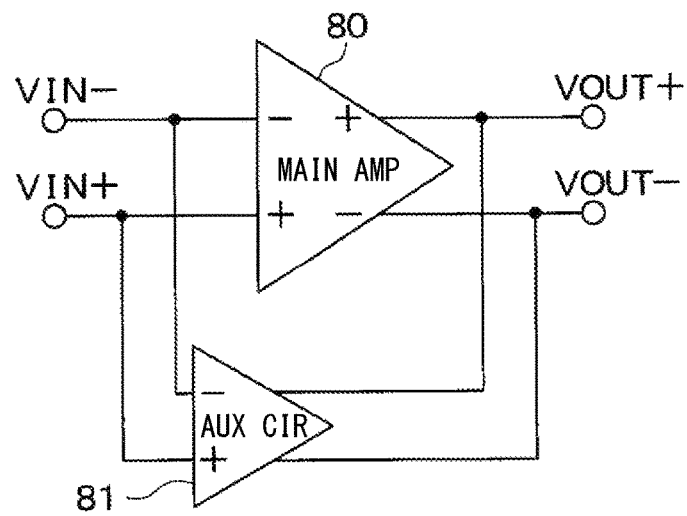
FIG. 12 is a diagram for explaining a problem.

The amplifier circuit 1 according to the sixth embodiment is described with reference to FIG. 11. The amplifier circuit 1 of the present embodiment, just like the amplifier circuit 1 of the fifth embodiment, interrupts the auxiliary bias currents I1 to I4 at the timing when the difference voltage between the two input signals to the main amplifier 10 falls within a predetermined range.

The amplifier circuit 1 of the present embodiment has a different configuration of the controller 30 as compared with the amplifier circuit 1 of the first embodiment. The comparator 31 of the present embodiment compares the difference voltage of two signals taken out from an internal node of the main amplifier 10 with a difference of the threshold voltages VREF1−VREF2. Further, the comparator 32 compares the difference voltage between the two signals taken out from the internal node of the main amplifier 10 with a difference of the threshold voltages VREF2−VREF1.

In such manner, the difference voltage between the two signals taken out from the internal node of the main amplifier 10 can be configured to be compared with a difference of the threshold voltages VREF1−VREF2 or a difference of the threshold voltages VREF2−VREF1.

As described above, the controller 30 can be configured by using the comparators 31, 32 and the OR circuit 33.

OTHER EMBODIMENTS (1) In each of the above embodiments, an example in which the amplifier circuit 1 is used for the AD converter is shown, but the amplifier circuit 1 can also be used for applications other than the AD converter.

(2) In each of the above embodiments, an example is shown in which a cut signal is output from the controller 30 at a timing synchronized with the time when the sample-and-hold signal input from the outside changes from the sample state to the hold state. On the other hand, the cut signal may be output from the controller 30 when a period of about ¾ of the hold period of the sample-and-hold signal elapses from the time when the sample-and-hold signal changes from the sample state to the hold state.

(3) In each of the above embodiments, an example in which a cut signal is output from the controller 30 at various timings is shown. On the other hand, for example, a delay circuit in which a plurality of inverters are connected in series may be provided in a subsequent stage of the controller 30, and the cut signal output from the controller 30 may be delayed by one clock by such delay circuit.

(4) In the second embodiment described above, an example in which the amplifier circuit 1 is used for the first-order ΔΣ type AD converter is shown. However, the amplifier circuit 1 can also be used for the second-order or higher ΔΣ type AD converter. Further, the amplifier circuit 1 can also be used for an oversampling type AD converter including a ΔΣ type AD converter. Further, the amplifier circuit 1 can also be used in a Nyquist type AD converter including a cyclic type AD converter.

The present disclosure is not limited to the above embodiment, and can be appropriately modified within the scope described in the claims. Individual elements or features of a particular embodiment are generally not limited to that particular embodiment, but, where applicable, are interchangeable and can be used in a selected embodiment, even if not specifically shown or described. Further, in each of the embodiments described above, each of elements/components of a particular embodiment is not necessarily essential unless it is specifically so stated in the foregoing description, or unless the elements are obviously essential in principle. Further, in each of the embodiments described above, when numerical values such as the number, numerical value, quantity, range, and the like of the constituent elements of the embodiment are referred to, except in case where the numerical values are expressly described as specific in particular or in case where the numerical values are obviously limited to a specific number in principle, and the like, the present disclosure is not limited to such specific number.

What is claimed is:

1. An amplifier circuit comprising:
a main amplifier;
an auxiliary circuit configured to improve a slew rate of the main amplifier; and
a controller for outputting a cut signal instructing the auxiliary circuit to interrupt the auxiliary bias current, wherein
the main amplifier and the auxiliary circuit are connected in parallel between input terminals and output terminals,
the main amplifier includes a one-stage CMOS amplifier configured to (i) amplify an input voltage difference between two input signals input from the input terminals, and (ii) output, from the output terminals, output signals corresponding to the input voltage difference,
the auxiliary circuit is configured to (i) generate an auxiliary bias current according to the input voltage difference, and (ii) interrupt, upon receiving an interrupt signal, the auxiliary bias current at a predetermined timing before completion of settling,
the auxiliary circuit (i) includes an amplifier circuit, and (ii) is configured to interrupt the auxiliary bias current when the cut signal is received from the controller,
the cut signal is at least part of the interrupt signal,
the output terminals include a positive output terminal and a negative output terminal,
the auxiliary circuit includes
a first P-type MOSFET connected to the negative output terminal and controlling the auxiliary bias current flowing through the negative output terminal,
a first N-type MOSFET connected to the negative output terminal and controlling the auxiliary bias current flowing through the negative output terminal,
a second P-type MOSFET connected to the positive output terminal and controlling the auxiliary bias current flowing through the positive output terminal, and
a second N-type MOSFET connected to the positive output terminal and controlling the auxiliary bias current flowing through the positive output terminal, and
when the cut signal is input from the controller to the auxiliary circuit, the amplifier circuit is configured to turn OFF the first P-type MOSFET, the first N-type MOSFET, the second P-type MOSFET, and the second N-type MOSFET.

2. The amplifier circuit of claim 1, wherein
the auxiliary circuit includes
a first control P-type MOSFET arranged between a power supply line and a gate of the first P-type MOSFET for turning OFF the first P-type MOSFET,
a first control N-type MOSFET arranged between a gate of the second N-type MOSFET and a ground line for turning OFF the second N-type MOSFET,
a second control P-type MOSFET arranged between the power supply line and the second P-type MOSFET for turning OFF the second P-type MOSFET, and
a second control N-type MOSFET arranged between a gate of the first N-type MOSFET and the ground line for turning OFF the first N-type MOSFET, and
when the cut signal is input from the controller, the first control P-type MOSFET, the first control N-type MOSFET, the second control P-type MOSFET, and the second control N-type MOSFET turn OFF the first P-type MOSFET, the second N-type MOSFET, the second P-type MOSFET, and the first N-type MOSFET respectively.

3. The amplifier circuit of claim 1, wherein
the predetermined timing is a timing in synchronization with a sample-and-hold signal.

4. The amplifier circuit of claim 1, wherein
the predetermined timing is a timing when the voltage difference of the input signals is within a predetermined range.

5. The amplifier circuit of claim 1, wherein
the amplifier circuit is part of a switched capacitor circuit.

6. The amplifier circuit of claim 1, wherein
the amplifier circuit is part of (a) an oversampling AD converter including a delta-sigma oversampling AD converter or (b) a Nyquist AD converter including a cyclic AD converter.

7. An amplifier circuit comprising:
a main amplifier configured to sample and to hold;
an auxiliary circuit configured to generate an auxiliary bias current for improving a slew rate of the main amplifier; and
a controller configured to generate an interrupt signal for interrupting the auxiliary bias current,
wherein:
the main amplifier and the auxiliary circuit are both connected to:
(i) a positive input terminal,
(ii) a negative input terminal,
(iii) a positive output terminal, and
(iv) a negative output terminal,
the auxiliary circuit is configured to interrupt, upon receiving the interrupt signal from the controller, the auxiliary bias current such that the auxiliary bias current becomes substantially zero, and
the controller is configured to generate the interrupt signal at approximately halfway during a hold period.

8. The amplifier circuit of claim 7, wherein the main amplifier comprises:
a first series including, from top to bottom:
(i) a first P-type MOSFET,
(ii) a second P-type MOSFET,
(iii) a first N-type MOSFET, and
(iv) a second N-type MOSFET;
a second series including, from top to bottom:
(i) a third P-type MOSFET,
(ii) a fourth P-type MOSFET,
(iii) a third N-type MOSFET, and
(iv) a fourth N-type MOSFET; and
a fifth N-type MOSFET,
wherein:
a source of the first P-type MOSFET is connected to a power supply;

a drain of the second P-type MOSFET and a drain of the first N-type MOSFET are both connected to the negative output terminal;

a gate of the second N-type MOSFET is connected to the positive input terminal;

a source of the third P-type MOSFET is connected to the power supply;

a drain of the fourth P-type MOSFET and a drain of the third N-type MOSFET are both connected to the positive output terminal;

a gate of the fourth N-type MOSFET is connected to the negative input terminal;

a source of the second N-type MOSFET, a source of the fourth N-type MOSFET, and a drain of the fifth N-type MOSFET form a first node; and a source of the fifth N-type MOSFET is grounded.

9. The amplifier circuit of claim 8, wherein:

a gate of the first P-type MOSFET is connected to a gate of the third P-type MOSFET;

a gate of the second P-type MOSFET is connected to a gate of the fourth P-type MOSFET; and a gate of the first N-type MOSFET is connected to a gate of the third N-type MOSFET.

10. The amplifier circuit of claim 7, wherein:

the interrupt signal includes a first cut signal and a second cut signal; and the second cut signal is logically inverted relative to the first cut signal.

11. The amplifier circuit of claim 10, wherein the auxiliary circuit includes:

(i) a first current mirror circuit;
(iii) an auxiliary amplifier; and
(iii) a second current mirror circuit.

12. The amplifier circuit of claim 11, wherein the auxiliary circuit further includes:

a first P-type MOSFET in series with a first N-type MOSFET;

a second P-type MOSFET;

a second N-type MOSFET;

a third P-type MOSFET;

a third N-type MOSFET;

a fourth P-type MOSFET in series with a fourth N-type MOSFET;

a first interrupt signal terminal connected to a gate of the second P-type MOSFET and connected to a gate of the third P-type MOSFET; and a second interrupt signal terminal connected to a gate of the second N-type MOSFET and connected to a gate of the third N-type MOSFET, wherein:

sources of the first P-type MOSFET, the second P-type MOSFET, the third P-type MOSFET, and the fourth P-type MOSFET are connected to a power supply; and sources of the first N-type MOSFET, the second N-type MOSFET, the third N-type MOSFET, and the fourth N-type MOSFET are connected to a ground.

13. The amplifier circuit of claim 12, wherein:

the drain of the first P-type MOSFET and the drain of the first N-type MOSFET are connected to the negative output terminal; and the drain of the fourth P-type MOSFET and the drain of the fourth N-type MOSFET are connected to the positive output terminal.

* * * * *